United States Patent
Dobbins et al.

(10) Patent No.: US 10,685,925 B2
(45) Date of Patent: Jun. 16, 2020

(54) RESISTANCE AND CAPACITANCE BALANCING SYSTEMS AND METHODS

(71) Applicant: NVIDIA Corporation, Santa Clara, CA (US)

(72) Inventors: Jim Dobbins, Santa Clara, CA (US); Sheetal Jain, Santa Clara, CA (US); Don Templeton, Santa Clara, CA (US); Yaping Zhou, Santa Clara, CA (US); Wenjun Shi, Santa Clara, CA (US); Sunil Sudhakaran, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 32 days.

(21) Appl. No.: 15/881,631

(22) Filed: Jan. 26, 2018

(65) Prior Publication Data

US 2019/0237417 A1 Aug. 1, 2019

(51) Int. Cl.
| | |
|---|---|
| *H01L 29/66* | (2006.01) |
| *H01L 23/498* | (2006.01) |
| *H01L 23/66* | (2006.01) |
| *H01L 21/48* | (2006.01) |
| *H03H 7/42* | (2006.01) |
| *H01L 23/522* | (2006.01) |

(52) U.S. Cl.
CPC .......... *H01L 23/66* (2013.01); *H01L 21/4846* (2013.01); *H01L 23/49822* (2013.01); *H01L 23/49838* (2013.01); *H01L 23/5222* (2013.01); *H03H 7/425* (2013.01); *H01L 23/49866* (2013.01); *H01L 2223/6605* (2013.01); *H01L 2223/6661* (2013.01)

(58) Field of Classification Search
CPC ....................................................... H01L 23/66
USPC ....................................................... 257/664
See application file for complete search history.

(56) References Cited

U.S. PATENT DOCUMENTS

| | | |
|---|---|---|
| 4,710,854 A | 12/1987 | Yamada et al. |
| 5,945,886 A | 8/1999 | Millar |
| 5,986,893 A | 11/1999 | Leigh et al. |
| 6,232,560 B1 | 5/2001 | Lin |
| 6,426,550 B2 | 7/2002 | Ball et al. |
| 6,526,553 B1 | 2/2003 | Andreev et al. |
| 6,564,362 B2 | 5/2003 | Osaki et al. |

(Continued)

*Primary Examiner* — David Vu
*Assistant Examiner* — Brandon C Fox
(74) *Attorney, Agent, or Firm* — Zilka-Kotab, P.C.

(57) ABSTRACT

Systems and methods that facilitate resistance and capacitance balancing are presented. In one embodiment, a system comprises: a plurality of ground lines configured to ground components; and a plurality of signal bus lines interleaved with the plurality of ground lines, wherein the interleaving is configured so that plurality of signal bus lines and plurality of ground lines are substantially evenly spaced and the plurality of signal bus lines convey a respective plurality of signals have similar resistance and capacitance constants that are balanced. The plurality of signals can see a substantially equal amount ground surface and have similar amounts of capacitance. The plurality of signal bus lines can have similar cross sections and lengths with similar resistances. The plurality of signal bus lines interleaved with the plurality of ground lines can be included in a two copper layer interposer design with one redistribution layer (RDL).

17 Claims, 7 Drawing Sheets

(56) References Cited

U.S. PATENT DOCUMENTS

| | | | |
|---|---|---|---|
| 6,571,380 B2 | 5/2003 | Roohparvar | |
| 6,588,005 B1 | 7/2003 | Kobayashi et al. | |
| 7,028,282 B2 | 4/2006 | Roohparvar | |
| 7,291,923 B1 | 11/2007 | Lesea et al. | |
| 7,759,801 B1 | 7/2010 | Lesea et al. | |
| 7,898,370 B2 | 3/2011 | Zhou et al. | |
| 8,937,389 B2 | 1/2015 | Liu et al. | |
| 8,946,900 B2 | 2/2015 | Qian et al. | |
| 9,036,364 B1 | 5/2015 | Fung | |
| 9,629,246 B2 | 4/2017 | Mu et al. | |
| 2006/0173343 A1 | 8/2006 | Guo et al. | |
| 2007/0290300 A1 | 12/2007 | Kawakami | |
| 2008/0088007 A1* | 4/2008 | Quach | H01L 23/66 257/691 |
| 2008/0129717 A1* | 6/2008 | Lee | G09G 3/3677 345/204 |
| 2008/0231393 A1* | 9/2008 | Chen | H01P 3/08 333/246 |
| 2009/0314105 A1* | 12/2009 | Dattalo | G01D 5/2405 73/862.626 |
| 2013/0220690 A1* | 8/2013 | Chang | H05K 1/025 174/262 |
| 2015/0195906 A1 | 7/2015 | Chang et al. | |
| 2015/0332960 A1* | 11/2015 | Chen | H01L 21/0337 438/618 |
| 2017/0213776 A1* | 7/2017 | Oikawa | H01L 23/00 |

* cited by examiner

RESISTANCE AND CAPACITANCE BALANCING SYSTEMS AND METHODS

FIELD OF THE INVENTION

The present invention relates to integrated circuit fabrication and balancing of resistance and capacitance.

BACKGROUND

Numerous electronic technologies such as digital computers, video equipment, and telephone systems have facilitated increased productivity and reduced costs in processing information in most areas of business, science, and entertainment. The electronic systems often include integrated circuits that process signals. Accurate signal processing is important for proper performance. However, there are a number of factors that can impact accurate signal processing. Resistance and capacitance balance or lack thereof can have a significant impact on signal processing performance.

High speed parallel buses in silicon interposers usually have strong resistance and capacitance (RC) effects due to fine metal size and spacing. For example, conventional high bandwidth memory (HBM) over interposer's metal width is approximately 1 um. Next generation HBM could run at speeds of approximately 4 Gbps, and the theoretical valid timing window is only 125 ps. It can be critical to keep resistance and capacitance (RC) time constants equal for multiple signals, otherwise introduced skew could easily violate or "kill" a timing margin. FIG. 1 is a block diagram of a conventional re-distribution layer (RDL) mesh grid. The system of FIG. 1 includes metal one M1 layer components (shown in light gray), metal two M2 layer components (shown in dark gray), and redistribution layer (RDL) components (shown in lozenges with a cris-cross pattern). It is appreciated the M1, layer, M2 layer, and RDL layer can be separate layers in the silicon device and as projected into the illustration of FIG. 1. In one embodiment, both the M2 and RDL layers can have ground characteristics. The signal capacitance of metal layer 1 is quite different from the signal capacitance of metal layer 2, due to the extra capacitance between metal layer 1 to RDL.

SUMMARY

Systems and methods that facilitate resistance and capacitance balancing are presented. In one embodiment, a system comprises: a plurality of ground lines configured to supply a ground voltage to components; and a plurality of signal bus lines interleaved with the plurality of ground lines. The interleaving is configured so that the plurality of signal bus lines and plurality of ground lines are substantially evenly spaced and the plurality of signal bus lines convey a respective plurality of signals that have similar resistance and capacitance (RC) time constants. The plurality of signals can see a substantially equal amount of ground surface and have similar amounts of capacitance. The plurality of signal bus lines can have similar cross sections and lengths. The plurality of signal bus lines can have similar resistances. In one exemplary implementation, similar RC time constants are balanced and the cross talk is low. The plurality of signal bus lines interleaved with the plurality of ground lines can be included in a two copper layer interposer design with one redistribution layer (RDL).

In one embodiment, a ground and signal line fabrication method comprises: fabricating a plurality of ground lines; and fabricating a plurality of signal bus lines interleaved with the plurality of ground lines, wherein the interleaving is configured so that the plurality of signal bus lines and plurality of ground lines are substantially evenly spaced and the plurality of signal bus lines convey a respective plurality of signals that have similar resistance and capacitance time constants that are balanced.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Systems and methods that facilitate resistance and capacitance balancing are presented. In one embodiment, the systems and methods facilitate resistance and capacitance time constant (RC) balancing. In one exemplary implementation, channel skew is reduced and high speed HBM interface channel performance improves. In one embodiment, the system is included in a an integrated circuit. In one exemplary implementation, the integrated circuit includes a high speed signal distribution circuit.

In one embodiment, a high speed signal distribution circuit includes a plurality of ground lines configured to supply a ground voltage to components and a plurality of signal bus lines configured to convey signals to components. The plurality of signal bus lines are interleaved with the plurality of ground lines. In one exemplary implementation, similar RC constants for the plurality of signal bus lines interleaved with the plurality of ground lines is achieved by evening the spacing in-between the interleaved plurality of signal bus lines and plurality of ground lines. The plurality of signal bus lines can convey a respective plurality of signals.

In one exemplary implementation, the plurality of signal bus lines have similar cross sections and lengths. Thus, the plurality of signal bus lines can have similar resistances. In one embodiment, at least two signals see a substantially equal amount of ground surface and have similar amounts of capacitance. The similar RC constants can be balanced.

Figure 1:
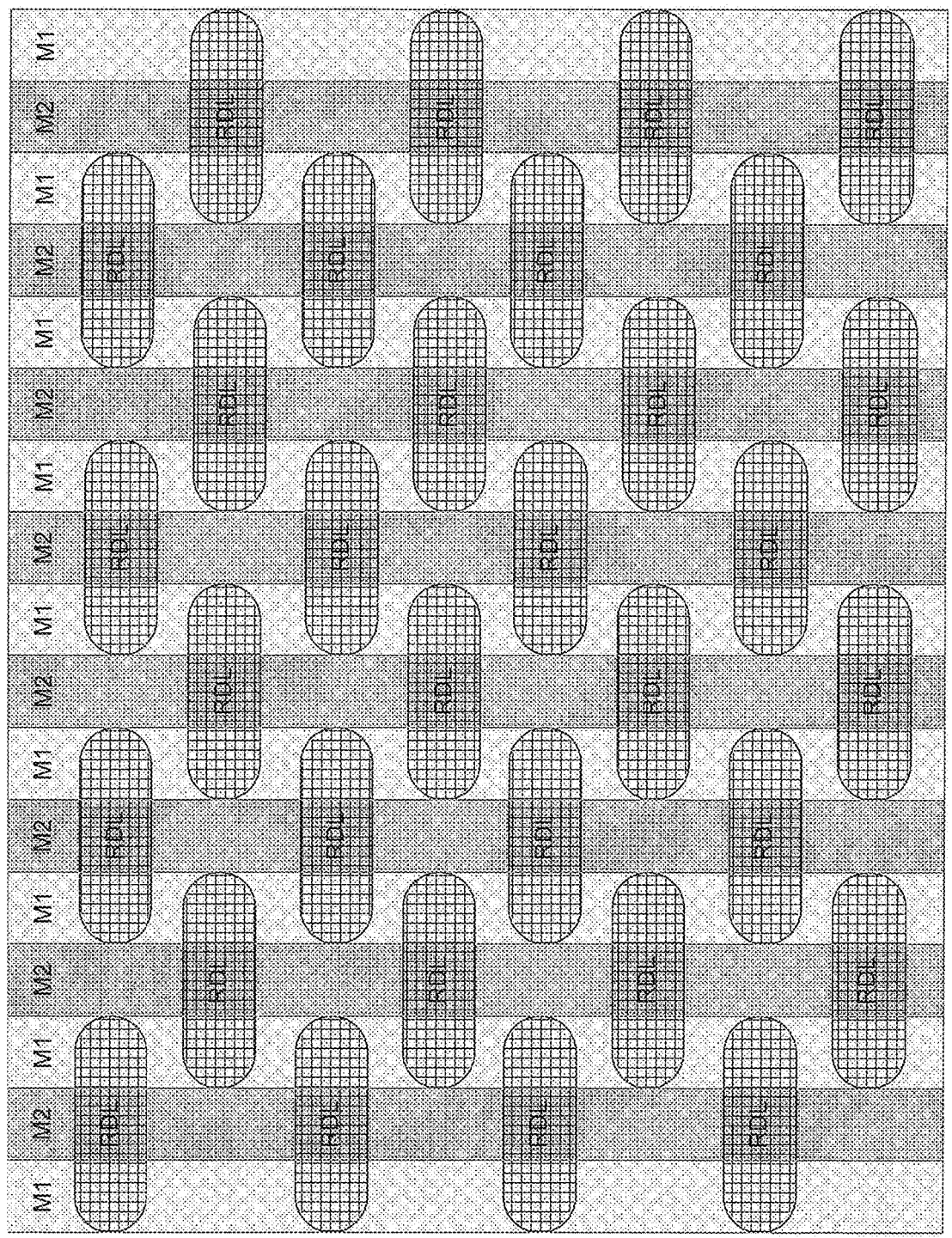
FIG. 1 is a block diagram of a conventional re-distribution layer (RDL) mesh grid.
Figure 2:
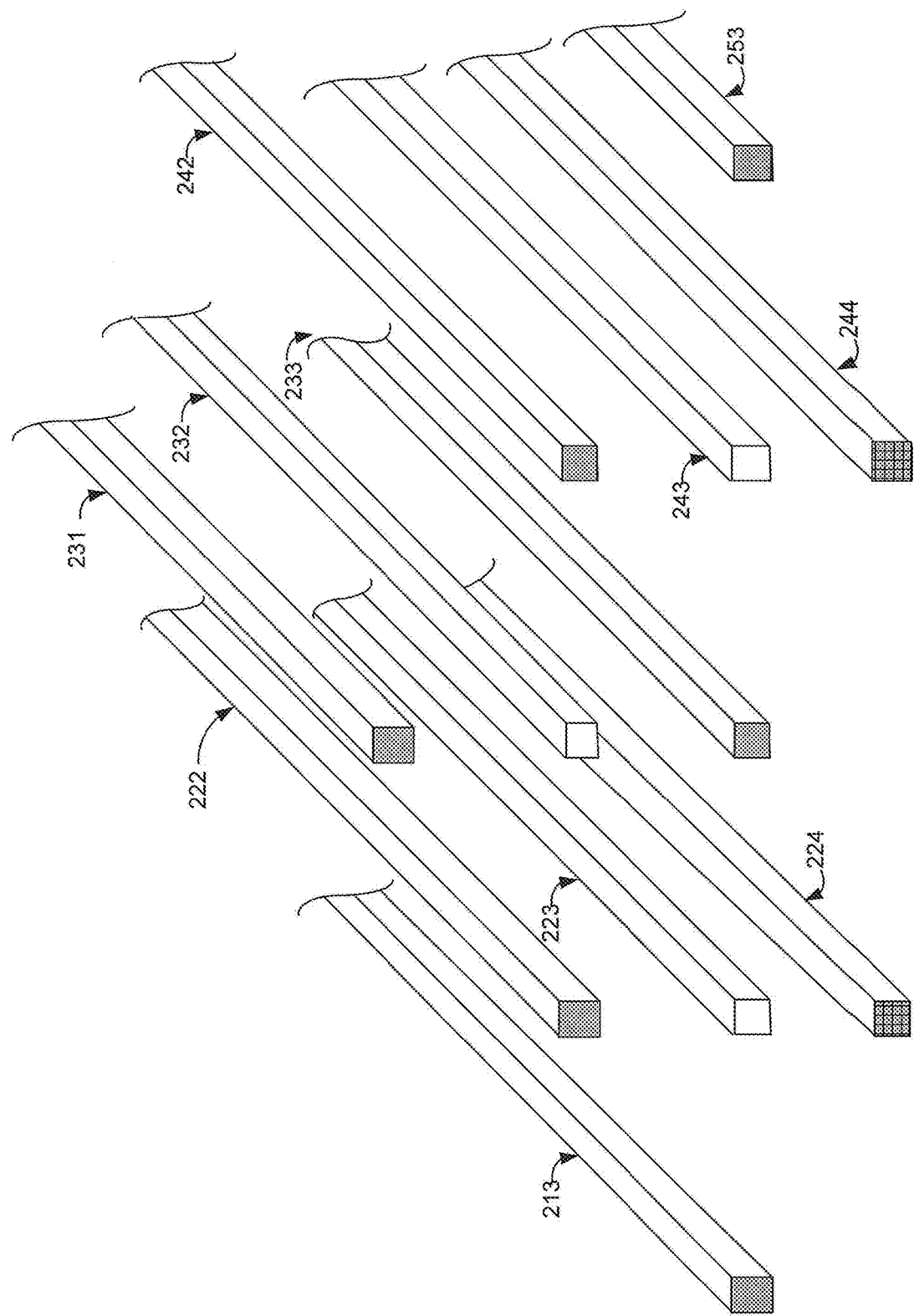
FIG. 2 is a block diagram of an exemplary interleaved ground and signal configuration in accordance with one embodiment.

FIG. 2 is a block diagram of an exemplary interleaved ground and signal configuration in accordance with one embodiment. Ground lines or traces 213, 222, 231, 233, 242 and 253 are interleaved with signal lines or traces 223, 232 and 243. There is a gap between RDL ground 224 and 244 underneath ground 233. In one embodiment, each signal trace or line has the same number of adjacent ground signals or traces (e.g., three adjacent grounds, four adjacent grounds, etc.). Signal line or trace 223 is adjacent to four ground lines or traces 213, 222, 233, and 242. Signal line or trace 232 is adjacent to four ground lines or traces 222, 231, 233, and 242. Signal line or trace 243 is adjacent to four ground lines or traces, 233, 242, 244, and 253. In one embodiment, the plurality of signal bus lines interleaved with the plurality of ground lines are included in a two copper layer interposer design with one RDL layer.

Figure 3:
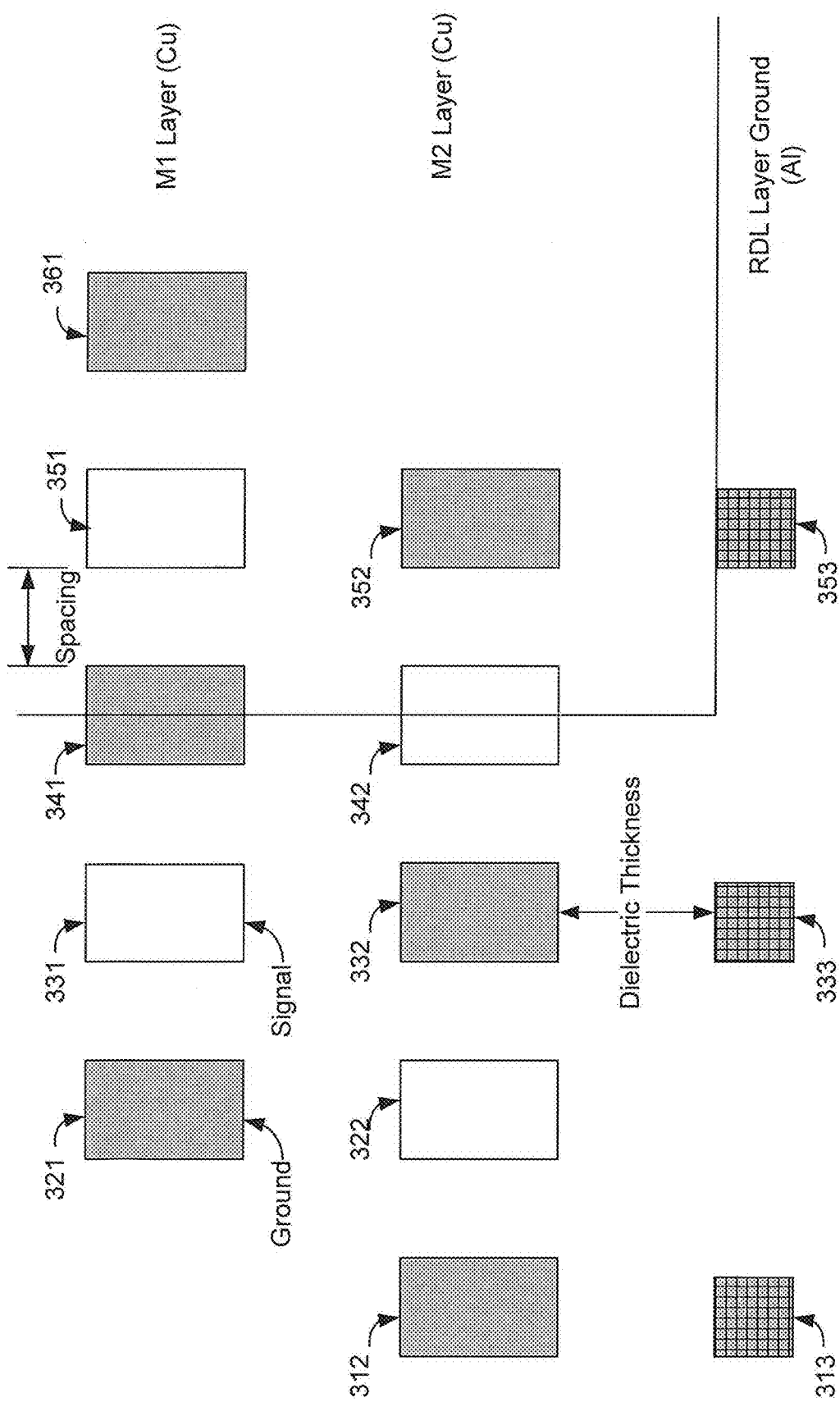
FIG. 3 is a block diagram of an exemplary interleaved ground and signal configuration in accordance with one embodiment.

FIG. 3 is a block diagram of an exemplary interleaved ground and signal configuration in accordance with one embodiment. In one embodiment, each signal trace or line has the same number of adjacent ground signals or traces (e.g., three adjacent grounds, etc.). As illustrated in the figure, there is no ground traces or leads underneath or adjacent to the signal traces or lines in the M2 layer. Thus, the signals or traces in the M1 and M2 layers have the same number of adjacent ground lines or traces and the signal lines or traces see the same or similar capacitance plate characteristics (e.g., from the three adjacent grounds, etc.).

Signal line or trace 332 is adjacent to three ground lines or traces 312, 321, and 332. Signal line or trace 331 is adjacent to three ground lines or traces 321, 332, and 341. Signal line or trace 342 is adjacent to three ground lines or traces 332, 341, and 352. Signal line or trace 351 is adjacent to three ground lines or traces 341, 352, and 361. There is a gap or space between RDL grounds 313 and 333 underneath signal 322. There is also a gap or space between RDL grounds 333 and 353 underneath signal 342.

The same or similar RC time constant can be achieved by interleaving the signal and ground trace lines and then adjusting the spacing in between to be relatively even. The dielectric thickness can also be fine tuned. As shown in the FIG. 3, there can be ground voids or spaces in the redistribution layer (RDL) layer under the plurality of signal bus lines or signal copper. Unlike conventional systems in which the signal capacitance of metal layer 1 is quite different from the signal capacitance of metal layer 2 (e.g., due to the extra capacitance between metal layer 2 to RDL, etc.), the presented approach in FIGS. 2 and 3 with ground voids or gaps in the RDL underneath signal copper can get rid of or reduce the extra capacitance and keep the RC constant relatively balanced. It is appreciated that the use of "void", "space", or "gaps" to express the absence of a ground trace or lead at a location does not necessarily indicate the location is void of other materials that make up the integrated circuit.

Figure 4:
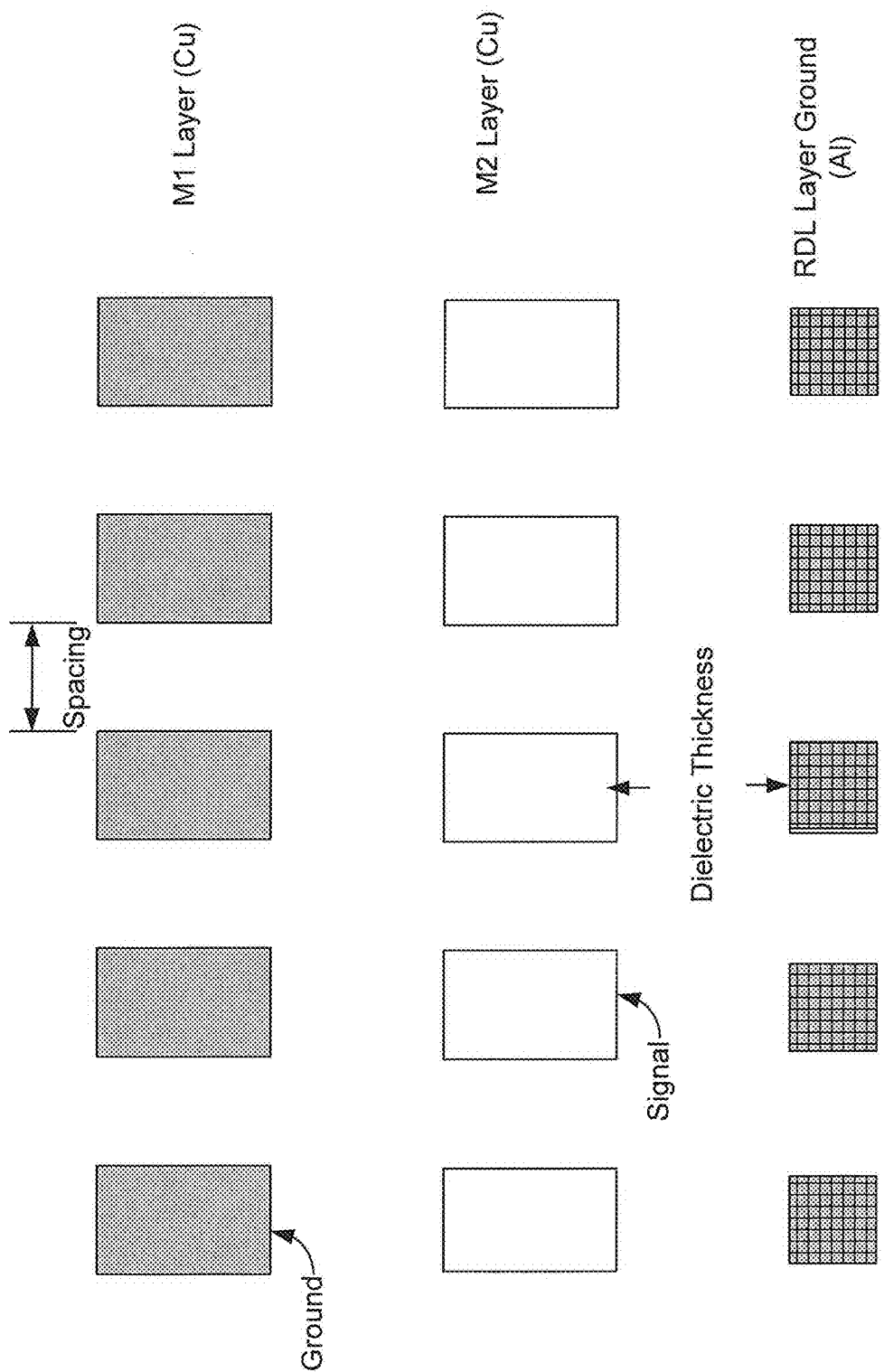
FIG. 4 is a block diagram of another exemplary ground and signal configuration in accordance with one embodiment.

FIG. 4 is a block diagram of another exemplary ground and signal configuration in accordance with one embodiment. In one embodiment, each signal trace or line has the same number of adjacent ground signals or traces (e.g., two adjacent grounds, four adjacent grounds, etc.). As illustrated in FIG. 4, there is one ground trace or lead above and one underneath the signal traces or lines in the M2 layer and thus the signals or traces in the M2 layer have the same number of adjacent ground lines or traces. Again, in one exemplary implementation, the signal lines or traces see the same or similar capacitance plate characteristics.

Figure 5:
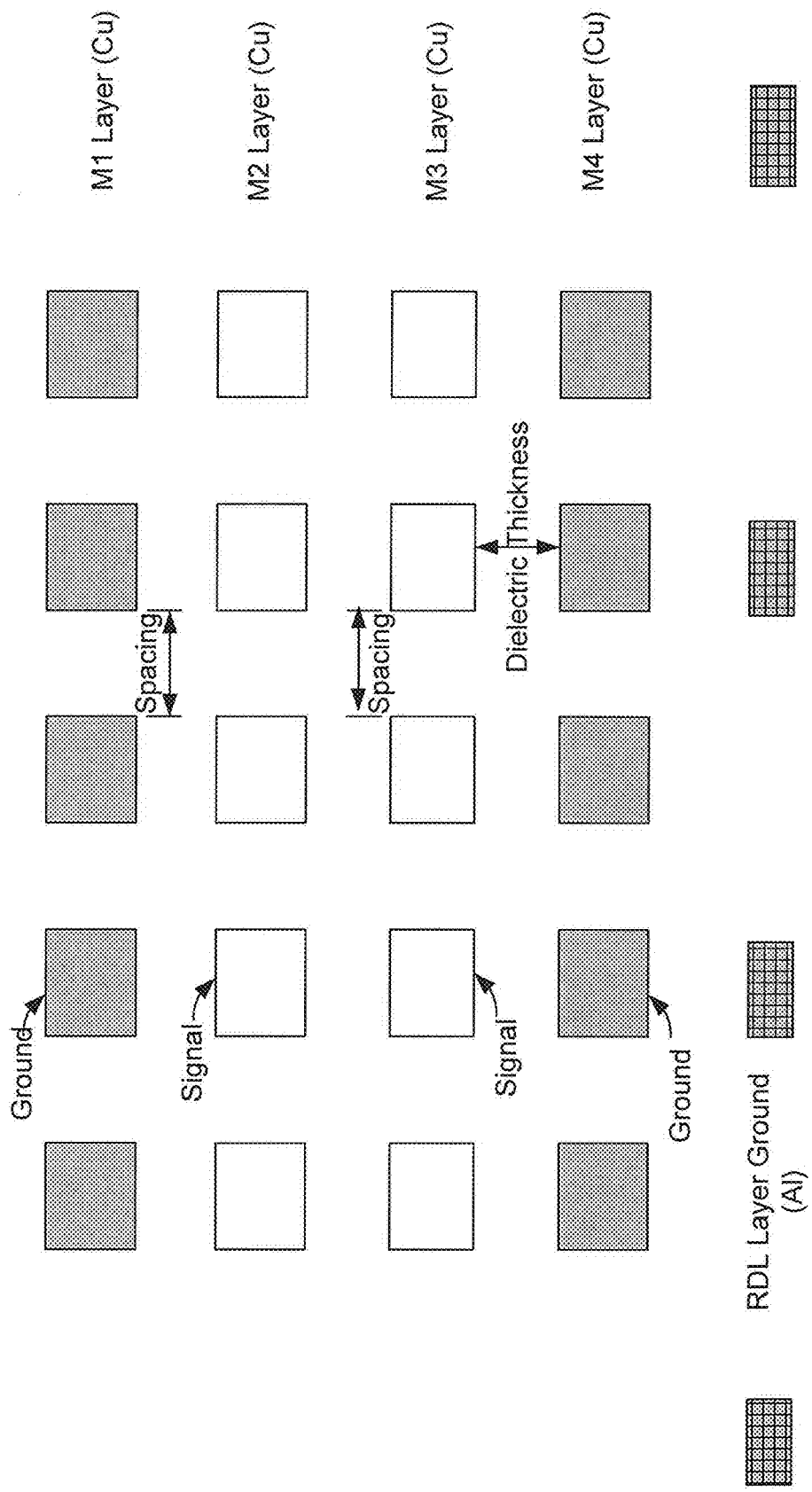
FIG. 5 is a block diagram of another exemplary ground and signal configuration in accordance with one embodiment.

FIG. 5 is a block diagram of another exemplary ground and signal configuration in accordance with one embodiment. In one embodiment, each signal trace or line has the same number of adjacent ground signal or traces (e.g., one adjacent ground, etc.). As illustrated in the figure, there is one ground trace or lead underneath the signal traces or lines in the M3 layer and one ground traces or leads above the signal traces or lines in the M2 layer. Again, in one exemplary implementation, the signal lines or traces see the same or similar capacitance plate characteristics.

Figure 6:
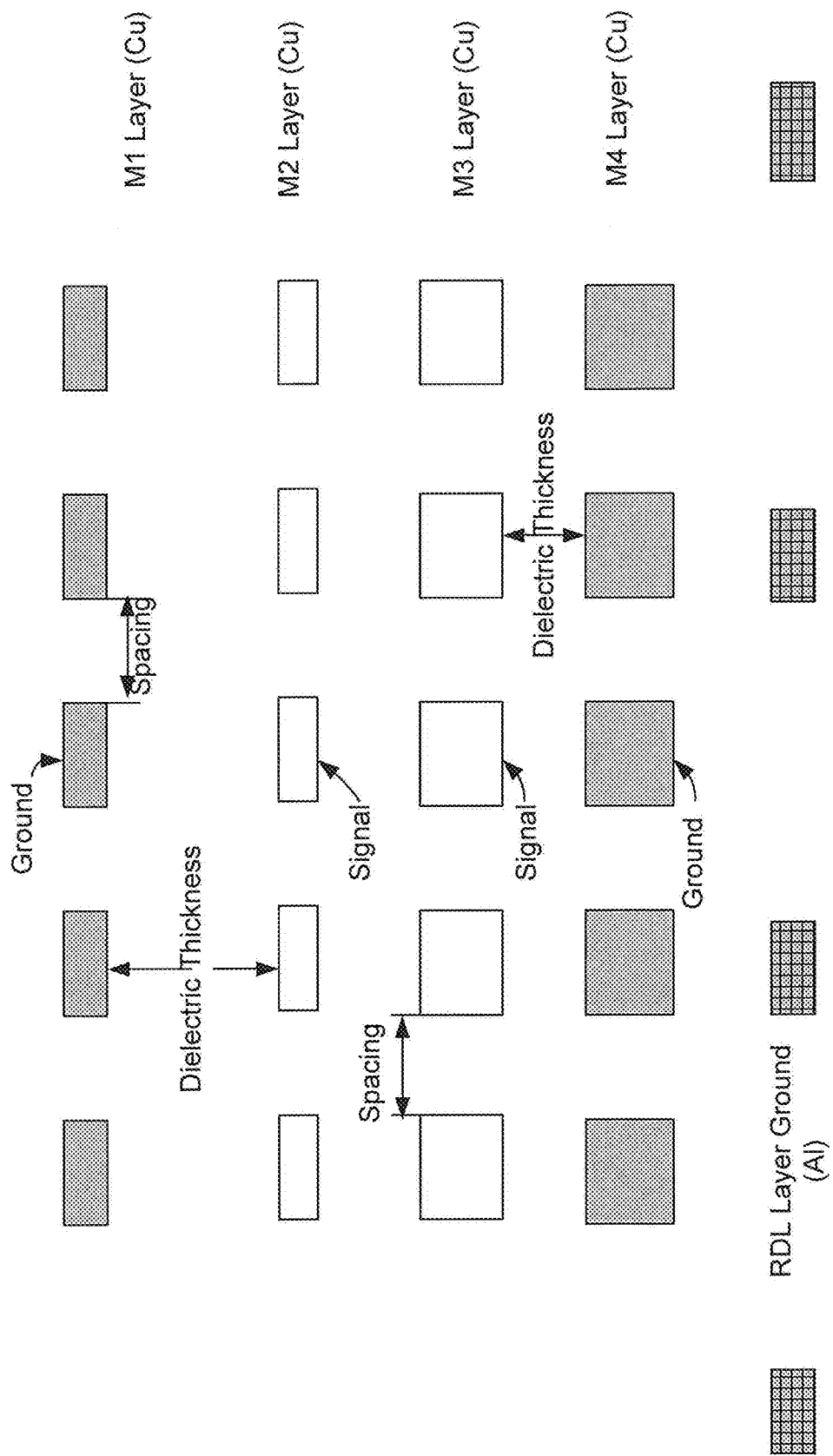
FIG. 6 is a block diagram of another exemplary ground and signal configuration in accordance with one embodiment.

The configuration of the signal and ground line widths and heights can change, and the spacing and dielectric thickness between the signal and ground line can also change. FIG. 6 is a block diagram of another exemplary ground and signal configuration in accordance with one embodiment. In one embodiment, each signal trace or line has the same number of adjacent ground signal or traces (e.g., one adjacent ground, etc.) but the dielectric distance is different. As illustrated in the figure, the dielectric thickness between the grounds in M1 and signals in M2 is different than the dielectric thickness between the signals in M3 and grounds in M4. In one exemplary implementation, the signal lines or traces see the same or similar capacitance plate characteristics.

Figure 7:
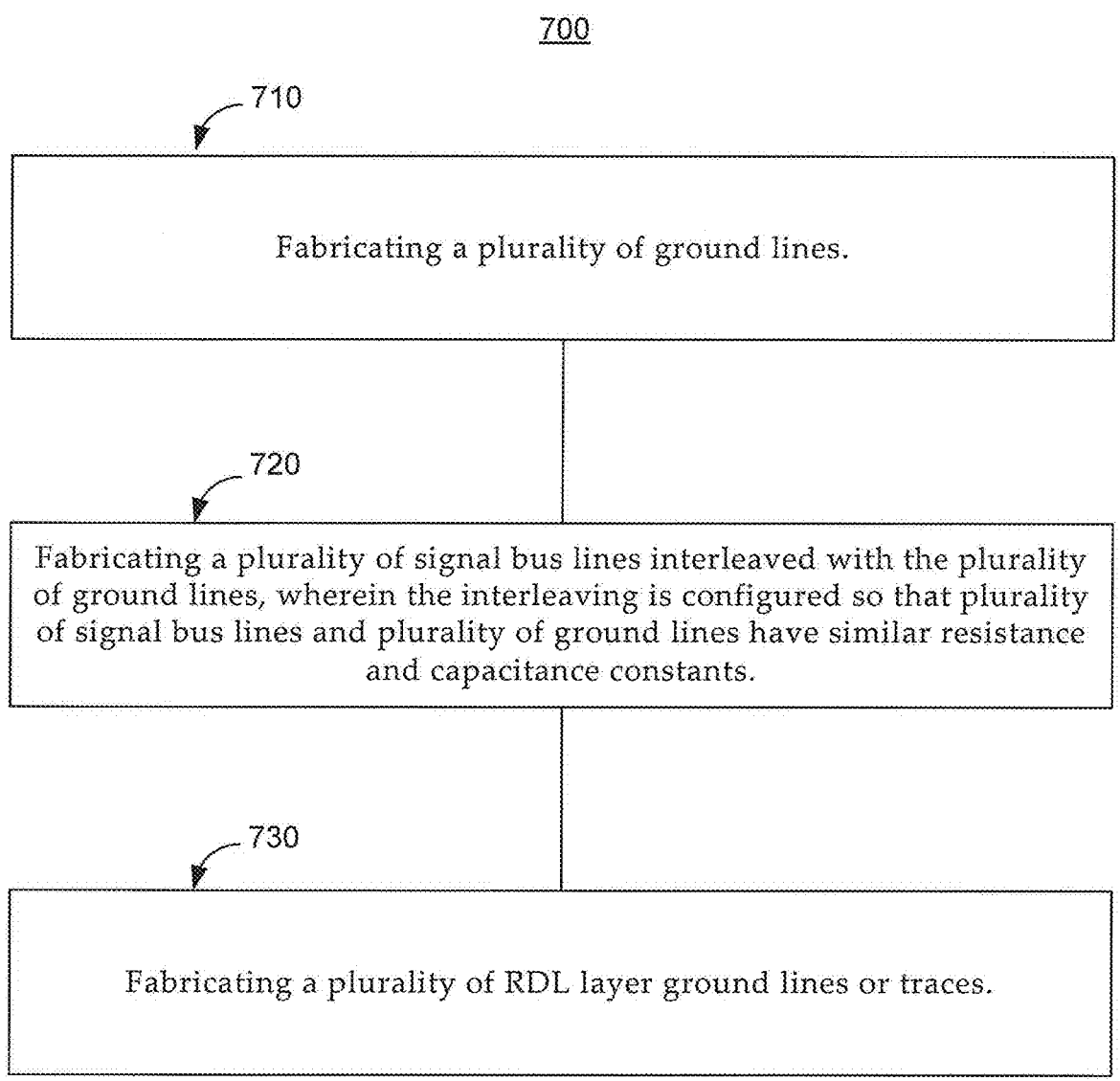
FIG. 7 is a flow chart of a ground and signal line fabrication method in accordance with one embodiment.

FIG. 7 is a flow chart of a ground and signal line fabrication method in accordance with one embodiment.

In block 710, a plurality of ground lines or traces are fabricated.

In block 720, a plurality of signal lines or traces are fabricated. In one embodiment, the plurality of signal lines are interleaved with the plurality of ground lines. The interleaving can be configured so that the plurality of signal bus lines and plurality of ground lines are substantially evenly space. The plurality of signal bus lines convey a respective plurality of signals that have similar resistance and capacitance constants that are balanced.

In block 730, a plurality of RDL layer ground lines or traces are fabricated. The plurality of RDL layer ground lines can be configured so that the plurality of RDL layer ground lines are not adjacent the plurality of signal lines.

The plurality of signals can see a substantially equal amount ground surface and have similar amounts of capacitance. The plurality of signal bus lines can have similar cross sections and lengths. The plurality of signal bus lines can have similar resistances. In one embodiment, at least two signals see a substantially equal amount of ground surface and have similar amounts of capacitance. The dielectric thickness can be adjusted. Similar RC constants can be balanced. In one exemplary implementation the cross talk is low. The plurality of signal bus lines interleaved with the plurality of ground lines can be included in a two copper layer interposer design with one RDL layer. The plurality of signal bus lines can have similar cross sections and lengths with similar resistances.

By providing balanced RC across signals, channel skew is reduced and high speed HBM interface channel performance improves. It can also increase the margin required to run the HBM interface at speed.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

In one embodiment, the components or configurations are described as having a characteristic or feature (e.g., equal, similar, parallel, coincident, etc.). It is appreciated the components and configurations can be designed or intended to have the characteristics and configurations within acceptable deviation parameters. The deviation parameters can correspond to manufacturing characteristics or limits.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical or quantum computing device) that manipulates and transforms data represented as physical (e.g., electronic) quantities. The terms refer to actions and processes of the processing devices that manipulate or transform physical quantities within a computer system's components (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as suited to the particular use contemplated. It is intended that the scope of the invention be defined by the Claims appended hereto and their equivalents. The listing of steps within method claims do not imply any particular order to performing the steps, unless explicitly stated in the claim.

What is claimed:

1. A high speed signal distribution circuit in an integrated circuit, wherein the distribution circuit comprises:
    a plurality of ground lines configured to supply a ground voltage to components; and
    a plurality of signal bus lines interleaved with the plurality of ground lines, wherein the interleaving is configured so that the plurality of signal bus lines and the plurality of ground lines are substantially evenly spaced and the plurality of signal bus lines transmit a respective plurality of signals, wherein resistance and capacitance (RC) time constants of the plurality of signal bus lines are balanced, and wherein the plurality of signal bus lines and the plurality of ground lines are included in a corresponding two copper layer interposer design with one associated redistribution layer (RDL),wherein as widths and heights of the plurality of ground lines and plurality of signal bus lines differ, the respective spacing and dielectric thickness between the plurality of ground lines and plurality of signal bus lines correspondingly differ to maintain the balance of the RC constants.

2. The integrated circuit of claim 1, wherein the plurality of signal bus lines are sufficiently balanced to avoid violating a timing margin.

3. The integrated circuit of claim 1, wherein at least two of the plurality of signal bus lines have a same number of adjacent ground lines.

4. The integrated circuit of claim 1, wherein the plurality of signal bus lines have substantially similar resistances such that the (RC) time constants are balanced.

5. The integrated circuit of claim 1, wherein at least two signals see a substantially equal amount of ground surface and have substantially similar amounts of capacitance, such that the (RC) time constants are balanced.

6. The integrated circuit of claim 1, wherein there are respective gaps disposed between each of plurality of ground lines and said respective gaps are also disposed under each of the plurality of signal bus lines.

7. The integrated circuit of claim 1, wherein the plurality of signal bus lines have substantially similar cross sections and lengths and respective spacing between the plurality of ground lines and plurality of signal bus lines is set such that the (RC) time constants that are balanced.

8. A ground and signal line fabrication method comprising:
    fabricating a plurality of ground lines; and
    fabricating a plurality of signal bus lines interleaved with the plurality of ground lines, wherein the interleaving is configured so that the plurality of signal bus lines and the plurality of ground lines are substantially evenly spaced and the plurality of signal bus lines transmit a respective plurality of signals wherein resistance and capacitance (RC) time constants of the plurality of signal bus lines are balanced, and wherein a dielectric thickness is adjusted to maintain RC time constant balancing, wherein as widths and heights of the plurality of ground lines and plurality of signal bus lines differ, the respective spacing and dielectric thickness between the plurality of ground lines and plurality of signal bus lines correspondingly differ to maintain the balance of the RC constants.

9. The method of claim 8, wherein the plurality of signal bus lines are sufficiently balanced to avoid violating a timing margin.

10. The method of claim 8, wherein at least two of the plurality of signal bus lines are configured with a same number of adjacent ground lines.

11. The method of claim 8, wherein the plurality of signal bus lines have substantially similar resistances such that the (RC) time constants are balanced.

12. The method of claim 8, wherein at least two signals see a substantially equal amount of ground surface and have substantially similar amounts of capacitance, such that the (RC) time constants that are balanced.

13. The method of claim 8, wherein there are respective ground gaps disposed between each of plurality of ground lines and said respective gaps are also disposed under each of the plurality of signal bus lines.

14. The method of claim 8, wherein the plurality of signal bus lines have substantially similar cross sections and lengths and respective spacing between the plurality of ground lines and plurality of signal bus lines is set such that the (RC) time constants are balanced.

15. The method of claim 8, wherein the plurality of signal bus lines interleaved with the plurality of ground lines are included in a corresponding two copper layer interposer design with one associated redistribution layer (RDL).

16. The method of claim 8, wherein a ground gap between two of the plurality of ground lines in a layer adjacent to a layer comprising a corresponding one of plurality of signal bus lines regulates capacitive interference on the RC constant.

17. The method of claim 8, wherein first one of the plurality of ground lines is associated with and located under a first one of the plurality of bus lines and a second one of the plurality of ground lines is associated with and located above a second one of the plurality of bus lines, wherein the first one of the plurality of bus lines is disposed in a first metal layer and the second one of the plurality of bus lines is disposed in a second metal layer.

* * * * *